(12) United States Patent
Kadomatsu et al.

(10) Patent No.: US 8,157,571 B2
(45) Date of Patent: Apr. 17, 2012

(54) HIGH-FREQUENCY MODULE HAVING A COAXIAL CONNECTOR WITH ITS CENTER CONDUCTOR CONTACTING A PRINT WIRING AT ONLY ONE POINT

(75) Inventors: Keijirou Kadomatsu, Tokyo (JP); Hiroshi Takahashi, Tokyo (JP); Kazumi Shiikuma, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/992,165

(22) PCT Filed: May 26, 2009

(86) PCT No.: PCT/JP2009/059607
§ 371 (c)(1),
(2), (4) Date: Nov. 11, 2010

(87) PCT Pub. No.: WO2009/145190
PCT Pub. Date: Dec. 3, 2009

(65) Prior Publication Data
US 2011/0104910 A1    May 5, 2011

(30) Foreign Application Priority Data
May 27, 2008   (JP) ................. P2008-138396

(51) Int. Cl.
*H01R 12/00* (2006.01)
(52) U.S. Cl. ........................................ 439/63
(58) Field of Classification Search ............... 439/63, 439/41, 884, 579, 580–585
See application file for complete search history.

(56) References Cited

U.S. PATENT DOCUMENTS

| | | | |
|---|---|---|---|
| 3,915,535 A * | 10/1975 | O'Keefe et al. | 439/63 |
| 6,099,322 A | 8/2000 | Beloritsky et al. | |
| 6,575,762 B2 * | 6/2003 | Evans | 439/63 |
| 6,609,322 B1 * | 8/2003 | Michelson | 42/71.02 |
| 6,909,051 B2 * | 6/2005 | Noble | 174/251 |
| 2009/0220013 A1 * | 9/2009 | Butts et al. | 375/257 |

FOREIGN PATENT DOCUMENTS

| | | |
|---|---|---|
| JP | 1-173580 A | 7/1969 |
| JP | 61-104651 A | 7/1986 |
| JP | 2-4231 A | 1/1990 |
| JP | 5-94972 A | 12/1993 |
| JP | 6-5158 A | 1/1994 |
| JP | 10-189083 A | 7/1998 |
| JP | 2000091780 A | 3/2000 |
| JP | 2004127940 A | 4/2004 |
| WO | 9704501 A | 2/1997 |
| WO | 9843323 A | 10/1998 |

OTHER PUBLICATIONS

International Search Report for PCT/JP2009/059607 mailed Aug. 4, 2009.

* cited by examiner

*Primary Examiner* — Chandrika Prasad

(57) ABSTRACT

A high-frequency module includes: a shield cover of the high-frequency module; a coaxial connector which is fixed to an outer side surface of the shield cover; a center conductor of the coaxial connector which protrudes to the inside of a region of the high-frequency module; and a metal plate terminal which is mounted on a print wiring formed on a substrate. The shield cover is fixed to the substrate so as to cover the upper portion thereof, while the center conductor of the coaxial connector is fitted to the metal plate terminal so as to allow input and output of a high-frequency signal.

9 Claims, 7 Drawing Sheets

US 8,157,571 B2

HIGH-FREQUENCY MODULE HAVING A COAXIAL CONNECTOR WITH ITS CENTER CONDUCTOR CONTACTING A PRINT WIRING AT ONLY ONE POINT

The present application is the National Phase of PCT/JP2009/059607, filed May 26, 2009, which claims priority based on Japanese patent application No. 2008-138396 filed on May 27, 2008.

TECHNICAL FIELD

The present invention relates to a high-frequency module and a wireless device, and more particularly, to a high-frequency module and a wireless device capable of easily performing an assembling operation and an inspection operation without performing a soldering operation in an input-output connection of a high-frequency signal.

BACKGROUND ART

Various technologies, in which a coaxial cable is connected to a terminal or the like mounted on a print substrate so as to be electrically connected to each other, are proposed (see Patent Documents 1 to 6).

For example, a thin coaxial connector, in which male and female center conductor pins of a connector are formed in a flat plate shape so as to decrease the entire height of a vertical coaxial connector, have been proposed (see Patent Document 3).

In addition, an electronic-device-box coaxial connection assembly including a fork-shaped contact arm for allowing a contact mounted along an edge of a printed circuit board to be plug-connected to a coaxial center conductor protruding to a cavity region of housing has been proposed (see Patent Document 5). In the electronic-device-box coaxial connection assembly, the printed circuit board is connected to the coaxial conductor by means of the plug-connection operation.

FIG. 12 shows a structure of a signal input-output portion between general high-frequency modules. In FIG. 12, a center conductor 9d of a coaxial cable 13a is connected to a portion on a print wiring 9c formed on a substrate 9b of a module 9 by means of a solder 9e. The coaxial cable 13a wired from a shield cover side surface 9a is connected to another module with coaxial connectors 13b and 13c interposed therebetween.

FIG. 13 is a view showing a structure of another related general high-frequency module. In FIG. 13, a center conductor 7d of a coaxial cable 8a is connected to a portion on a print wiring 7c formed on a substrate 7b of a module 7 by means of a solder 7e. The coaxial cable 8a wired from a shield cover side surface 7a is connected to another module with a coaxial connector 8b interposed therebetween.

However, in the input-output portion of the shielded high-frequency module, the following problem arises in the technology of soldering a coaxial cable such as a solid jacket cable including a coaxial connector to a substrate wiring. That is, transmission loss increases with cable length, and hence the efficiency decreases. For this reason, it is necessary to consider the deterioration in characteristics corresponding to the cable length. Since a shield cover is required for the high-frequency signal and a soldering operation of the center conductor of the coaxial cable of the input-output portion is performed manually, the efficiency of the soldering operation is bad, and it is difficult to perform the assembling operation and the inspection operation are difficult to be performed. In addition, since the coaxial cable exists between the modules, a problem arises in that a space used for wiring the cable is required and the device cannot be decreased in size.

Further, in the electronic-device-box coaxial connection assembly disclosed in Patent Document 5, a problem arises in that heat radiated by a highly heated component of the high-frequency module represented as a high-output amplifier or the like cannot be handled. Furthermore, since the contact arm is limited to having the fork shape, a problem arises in that the contact arm cannot be used for various purposes.

Patent Document 1: Japanese Utility Model Bulletin No. S61-104651
Patent Document 2: Japanese Utility Model Bulletin No. H05-094972
Patent Document 3: Japanese Utility Model Application Bulletin No. H06-005158
Patent Document 4: Japanese Patent Application, First Publication No. 2000-091780
Patent Document 5: Japanese Patent Application Publication No. 2001-518231
Patent Document 6: Japanese Patent Application Publication No. H11-510301

DISCLOSURE OF INVENTION

Problem to be Solved by the Invention

The present invention is conceived in consideration of the above-described circumstances, and an object of the invention is to improve electric characteristics and to easily perform an assembling operation and an inspection operation without performing out a soldering operation in an input-output connection of a high-frequency signal.

Means for Solving the Problem (1) According to one aspect of the invention, there is provided a high-frequency module including: a shield cover of the high-frequency module; a coaxial connector which is fixed to an outer side surface of the shield cover; a center conductor of the coaxial connector which protrudes to the inside of a region of the high-frequency module; and a metal plate terminal which is mounted on a print wiring formed on a substrate, wherein the shield cover is fixed to the substrate so as to cover the upper portion thereof, while the center conductor of the coaxial connector is fitted to the metal plate terminal so as to allow input and output of a high-frequency signal.

(2) According to another aspect of the invention, there is provided a high-frequency module including: a shield cover of the high-frequency module; a coaxial connector which is fixed to an outer side surface of the shield cover; a center conductor of the coaxial connector which protrudes to the inside of a region of the high-frequency module; and a print wiring which is formed on a substrate, wherein the center conductor is formed in a Z-shape so that a front end thereof has a spring property, and wherein the shield cover is fixed to the substrate so as to cover the upper portion thereof, while the center conductor of the coaxial connector directly contacts with the print wiring so as to allow input and output of a high-frequency signal.

(3) According to still another aspect of the invention, there is provided a wireless device including: a shield cover of a high-frequency module; a coaxial connector which is fixed to an outer side surface of the shield cover; a center conductor of the coaxial connector which protrudes to the inside of a region of the high-frequency module; and a metal plate terminal which is mounted on a print wiring formed on a substrate, wherein the shield cover is fixed to the substrate so as to cover the upper portion thereof, while the center conductor of the coaxial connector is fitted to the metal plate terminal so as to allow input and output of a high-frequency signal.

(4) According to still another aspect of the invention, there is provided a wireless device including: a shield cover of a high-frequency module; a coaxial connector which is fixed to an outer side surface of the shield cover; a center conductor of the coaxial connector which protrudes to the inside of a region of the high-frequency module; and a print wiring which is formed on a substrate, wherein the center conductor is formed in a Z-shape so that a front end thereof has a spring property, and wherein the shield cover is fixed to the substrate so as to cover the upper portion thereof, while the center conductor of the coaxial connector directly contacts with the print wiring so as to allow input and output of a high-frequency signal.

Effect of the Invention

In the high-frequency module and the wireless device according to the invention, it is possible to improve the electric characteristics and to easily perform the assembling operation and the inspection operation without performing the soldering operation in the input-output connection of the high-frequency signal.

REFERENCE SYMBOLS 2, 5, 7, 9, 20, 30, 40, 50, 60: HIGH-FREQUENCY MODULE 2a, 5a, 7a, 9a: SHIELD COVER
2b, 7b, 5b, 9b: SUBSTRATE
2c, 5c, 20c: METAL PLATE TERMINAL
2d, 5d, 12c: PRINT WIRING
2e, 5e: ARM
3a, 3b, 6a, 6b, 8b, 13b, 13c: COAXIAL CONNECTOR
3c, 3d, 6c, 6d, 7d, 9d, 12d: CENTER CONDUCTOR
3e: SPRING-SHAPED CENTER CONDUCTOR
4: INSULATING HOLD MEMBER
5f: METAL PLATE SPRING TERMINAL
5g: MULTI-CONTACT-POINT TERMINAL
5h: METAL-PLATE-TERMINAL CURVED PORTION
7c, 9c, 12e: PRINT WIRING
7e, 9e: SOLDER
8a, 13a: COAXIAL CABLE
11: FILTER
11a: RESONANCE BAR
11b: FILTER CAVITY
11c: RESONANCE BAR WIRING
12: AMPLIFIER
12a: AMPLIFIER CASE
12b: AMPLIFIER SUBSTRATE

BEST MODE FOR CARRYING OUT THE INVENTION

Hereinafter, exemplary embodiments of the invention will be described with reference to the accompanying drawings. In addition, since the embodiments described below are exemplary of the invention, various technically desirable limitations are added thereto. However, the scope of the invention is not limited to the exemplary embodiments unless a particular limitation of the invention is made as in the below description.

In a high-frequency module (circuit) according to the embodiments of the invention, a soldering connection is not performed between a substrate wiring and a connector center conductor for the signal input and output of the high-frequency module. For this reason, it is possible to reduce costs, to easily perform an assembling operation, and to reduce a loss.

Figure 1:
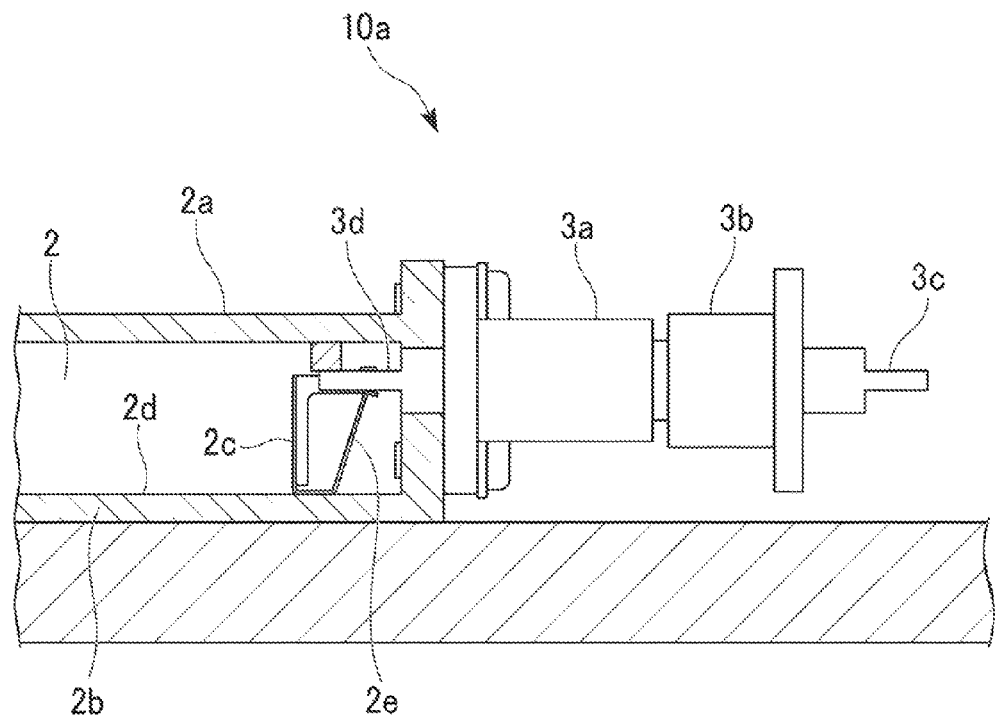
FIG. 1 is a side sectional view showing a structure of a wireless device according to a first embodiment of the invention.

A high-frequency module according to a first embodiment of the invention will be described with reference to FIGS. 1 to 3. FIG. 1 is a side sectional view showing the structure of a wireless device 10a according to the first embodiment of the invention. A coaxial connector 3a is fixed to a side surface of a shield cover 2a of a high-frequency module 2 of the wireless device 10a. A center conductor 3d of the coaxial connector 3a protrudes to the inside of the high-frequency module 2.

A metal plate terminal 2c is mounted on a print wiring 2d formed on the substrate 2b. The metal plate terminal 2c may be mounted thereon by means of an SMD (Surface Mount Device; surface mounting) automatic mounting operation. The shield cover 2a is fixed to the substrate 2b so as to cover the upper portion of the substrate. The center conductor 3d of the coaxial connector 3a is fitted between arms 2e of the metal plate terminal 2c in a contact state. Accordingly, it is possible to perform a connection operation without performing a soldering operation on the center conductor 3d of the coaxial connector 3a of the input-output portion. For this reason, it is possible to improve electric characteristics and to easily perform an assembling operation and an inspection operation.

In addition, the center conductor 3d and the metal plate terminal 2c may contact each other at one contact point, two contact points, or multiple contact points in accordance with a usage purpose or a space.

Further, another module may be directly connected to the coaxial connector 3b. In this case, it is possible to minimize mounting space without cabling operation or soldering operation. Also, it is possible to reduce the deterioration in characteristics and to reduce costs.

Furthermore, this embodiment relates to the high-frequency module represented as a high-output amplifier or the like and mounted with a highly heated component. For this reason, the substrate may be directly connected to a radiator or a diecast housing so as to radiate heat.

Hereinafter, the connection structure of the high-frequency module, that is, the connection between the center conductor 3d and the metal plate terminal 2c will be described in more detail.

Figure 2:
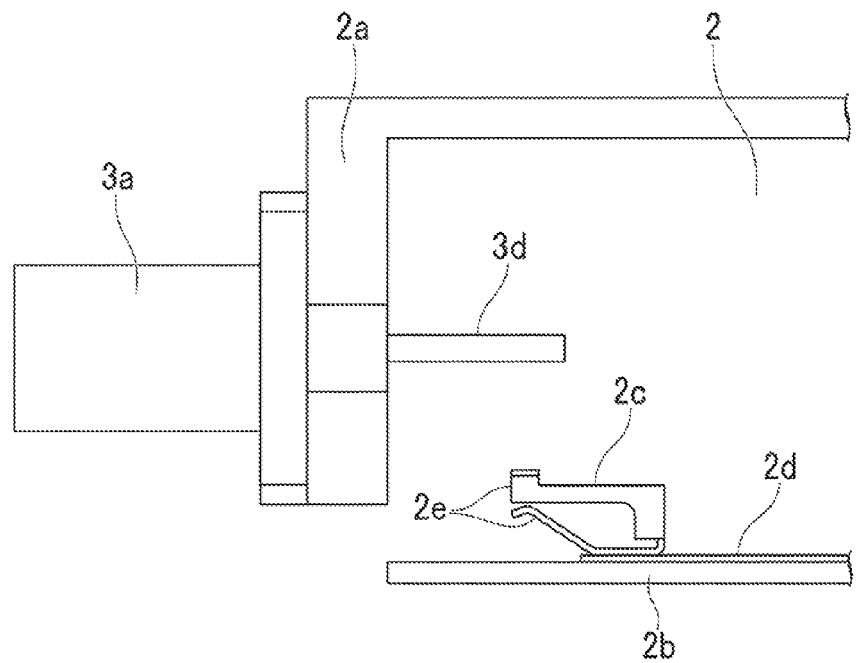
FIG. 2 is a side sectional view showing a structure of a high-frequency module according to the first embodiment of the invention.

FIG. 2 is a side sectional view showing the structure of the high-frequency module 2 according to the first embodiment of the invention. FIG. 2 shows the state before the center conductor 3d is connected to the metal plate terminal 2c. In FIG. 2, the coaxial connector 3a is fixed to the side surface of the shield cover 2a of the high-frequency module 2. The center conductor 3d of the coaxial connector 3a protrudes to the inside of the high-frequency module 2. The metal plate terminal 2c is mounted on the print wiring 2d formed on the substrate 2b by means of the SMD automatic mounting operation. As shown in FIG. 2, the shield cover 2a is fixed to the substrate 2b so as to cover the upper portion of the substrate. Accordingly, the center conductor 3d of the coaxial connector 3a is fitted between the arms 2e of the metal plate terminal 2c. That is, it is possible to simultaneously perform an attaching operation of the shield cover 2a and an input-output connection operation of the high-frequency signal.

Figure 3:
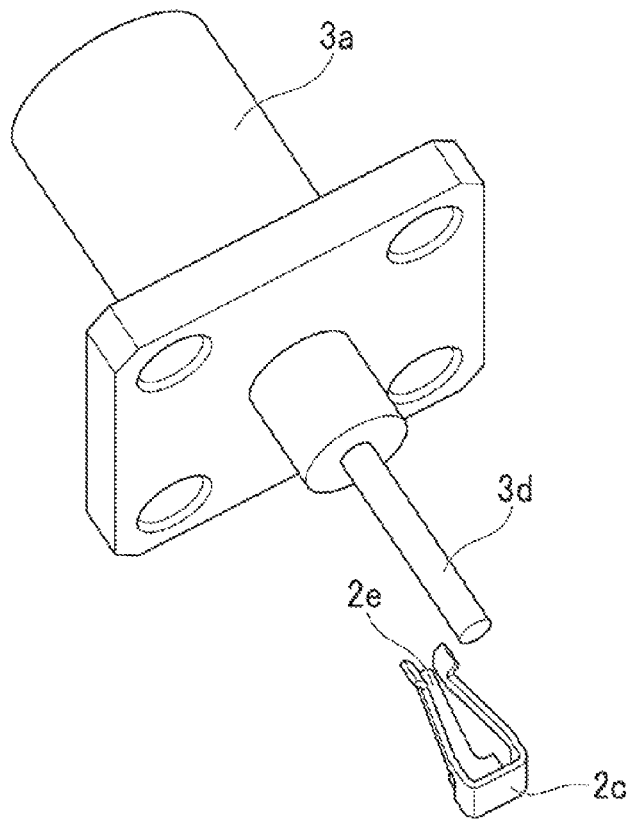
FIG. 3 is a perspective view showing the structure of a high-frequency module according to the first embodiment of the invention.

FIG. 3 is a perspective view showing the structure of the high-frequency module 2 according to the first embodiment of the invention. FIG. 3 shows the state before the center conductor 3d is connected to the metal plate terminal 2c.

As described above, in the high-frequency module according to the invention, since the center conductor 3d of the coaxial connector 3a contacts with the print wiring 2d formed on the substrate wiring or the metal plate terminal 2c mounted on the print wiring 2d, it is not necessary to perform the soldering operation. Accordingly, in the input-output portion of the high-frequency module (circuit), it is possible to improve electric characteristics and to easily perform an assembling operation and an inspection operation.

In addition, in the case where the modules are connected to each other without a cable, it is possible to reduce costs and a loss. Also, it is possible to reduce the size of the device.

Figure 4:
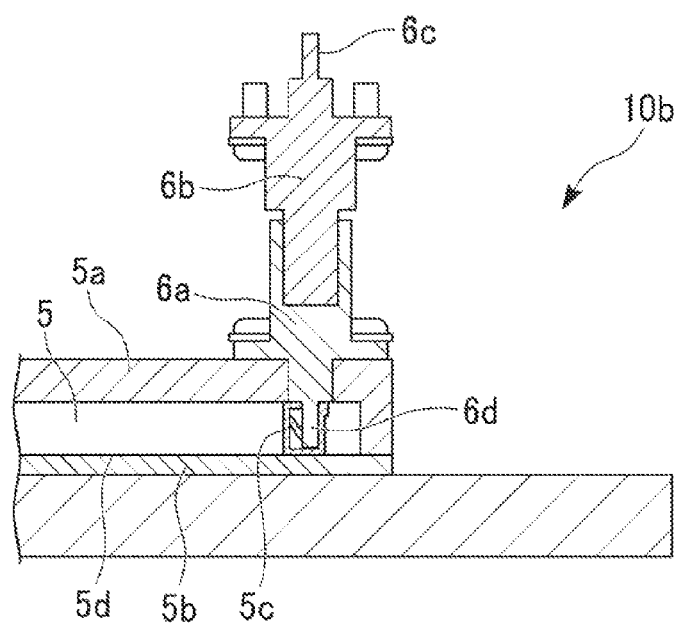
FIG. 4 is a side sectional view showing the structure of a wireless device according to a second embodiment of the invention.
Figure 5:
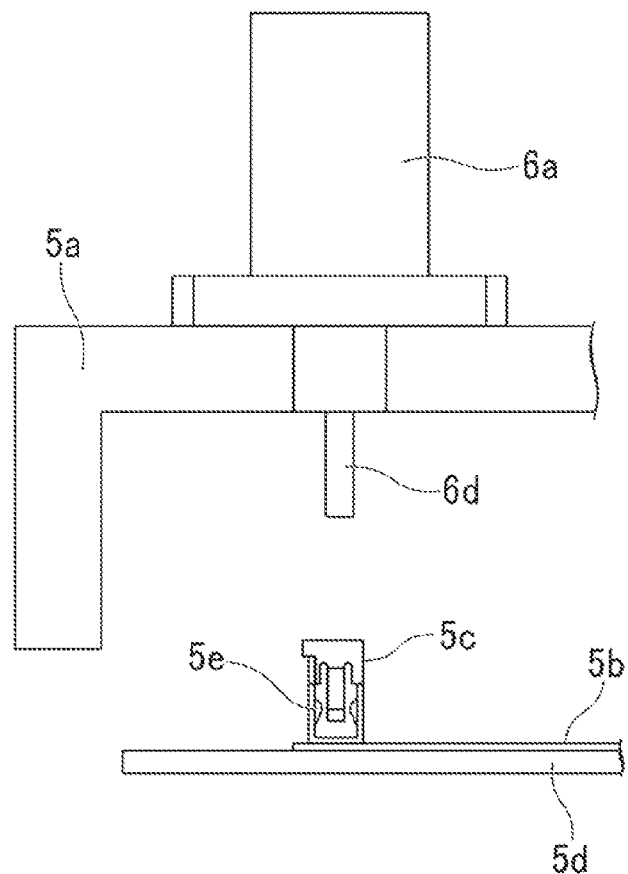
FIG. 5 is a side sectional view showing the structure of a high-frequency module according to the second embodiment of the invention.
Figure 6:
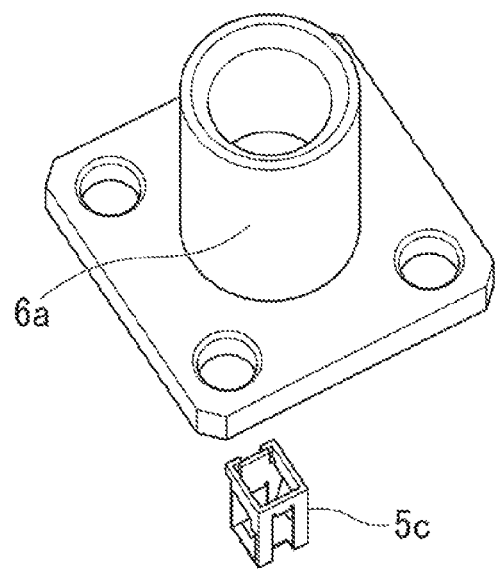
FIG. 6 is a perspective view showing the structure of a high-frequency module according to the second embodiment of the invention.

Next, a second embodiment of the invention will be described. FIG. 4 is a side sectional view showing the structure of the wireless device 10b according to the second embodiment of the invention. FIG. 5 is a side sectional view showing the structure of the high-frequency module 5 according to the second embodiment of the invention. FIG. 6 is a perspective view showing the structure of the high-frequency module 5 according to the second embodiment of the invention.

As shown in FIG. 4, coaxial connectors 6a and 6b are fixed to the upper surface of the shield cover 5a of the high-frequency module 5 of the wireless device 10b. A center conductor 6d of the coaxial connector 6a protrudes to the inside of the high-frequency module 5. The coaxial connector 6b includes a center conductor 6c.

The metal plate terminal 5c is mounted on the print wiring 5d formed on the substrate 5b. The metal plate terminal 5c may be mounted thereon by means of the SMD automatic mounting operation. The shield cover 5a is fixed to the substrate 5b so as to cover the upper portion of the substrate. The center conductor 6d of the coaxial connector 6a is fitted to the metal plate terminal 5c in a contact state. Accordingly, it is possible to perform a connection operation without performing a soldering operation on the center conductor 6d of the coaxial connector 6a of the input-output portion. For this reason, it is possible to improve electric characteristics and to easily perform an assembling operation and an inspection operation.

The high-frequency module 5 according to the second embodiment of the invention is formed to have a vertical-type structure. That is, an axial direction of the center conductor 6d is parallel to the direction vertical to a surface of the substrate 5b. In the vertical-type structure, the fitting operation is performed in the axial direction of the center conductor 6d, and the stress acting on the center conductor 6d and the metal plate terminal 5c is reduced, thereby further improving longtime reliability.

In addition, in the second embodiment of the invention, the two-contact-point connection may be simplified in order to simplify the metal plate terminal 5c and to reduce the cost thereof.

Figure 7:
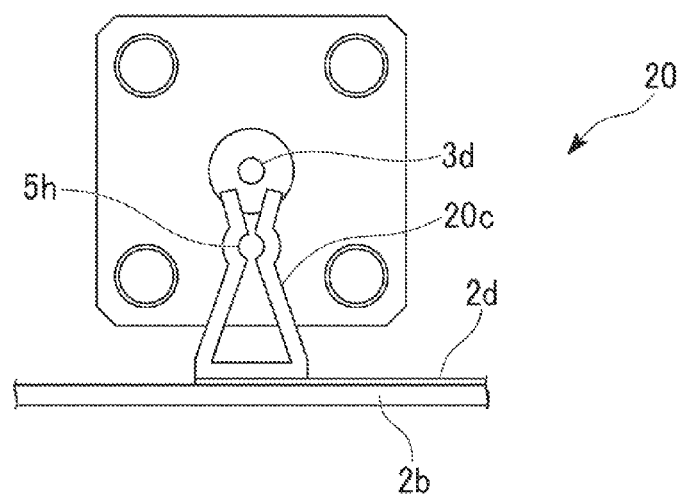
FIG. 7 is a view showing the structure of a high-frequency module according to a third embodiment of the invention.

FIG. 7 is a view showing the structure of a high-frequency module 20 according to a third embodiment of the invention. Additionally, in this embodiment, the same reference numerals will be given to the same components as those of the first embodiment, and the description thereof will be omitted.

A metal plate terminal 20c includes a curved portion 5h. In the connection operation of the shield cover, the center conductor 3d is interposed in the curved portion 5h, thereby having a reliable contact feeling and easily checking the connection state.

Figure 8:
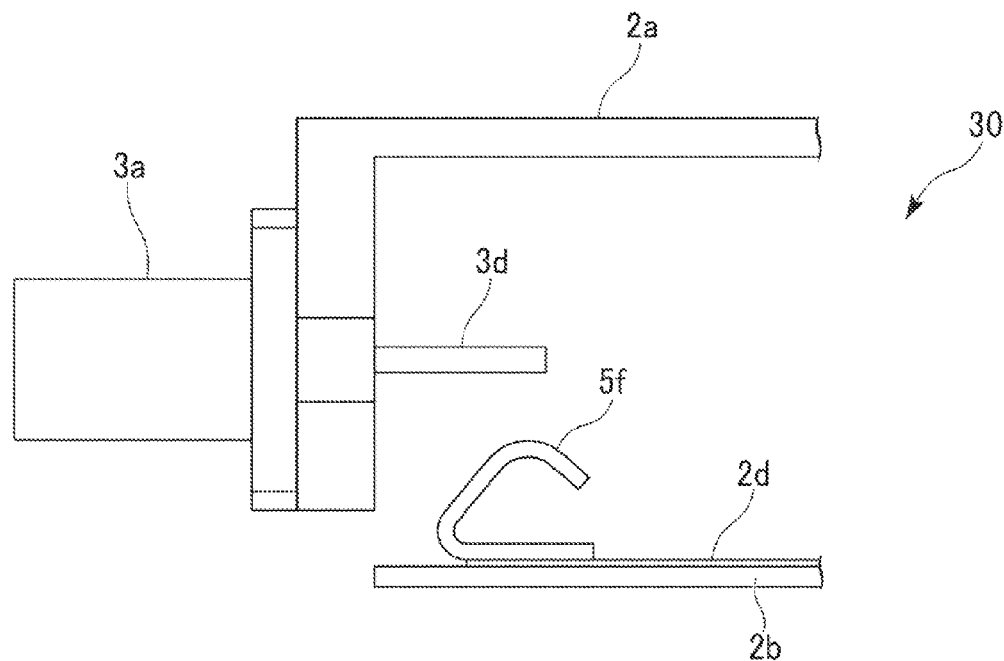
FIG. 8 is a side sectional view showing the structure of a high-frequency module according to a fourth embodiment of the invention.

FIG. 8 is a side sectional view showing the structure of a high-frequency module 30 according to a fourth embodiment of the invention. Additionally, in this embodiment, the same reference numerals will be given to the same components as those of the first embodiment, and the description thereof will be omitted.

In this embodiment, the center conductor 3d contacts with a metal plate terminal 5f formed by a spring member at one contact point, thereby performing the input-output connection of the high-frequency signal. Since the input-output connection of the high-frequency signal is performed at one contact point, it is possible to alleviate the positioning precision of the coaxial connector 3a or the metal plate terminal 5f.

Figure 9:
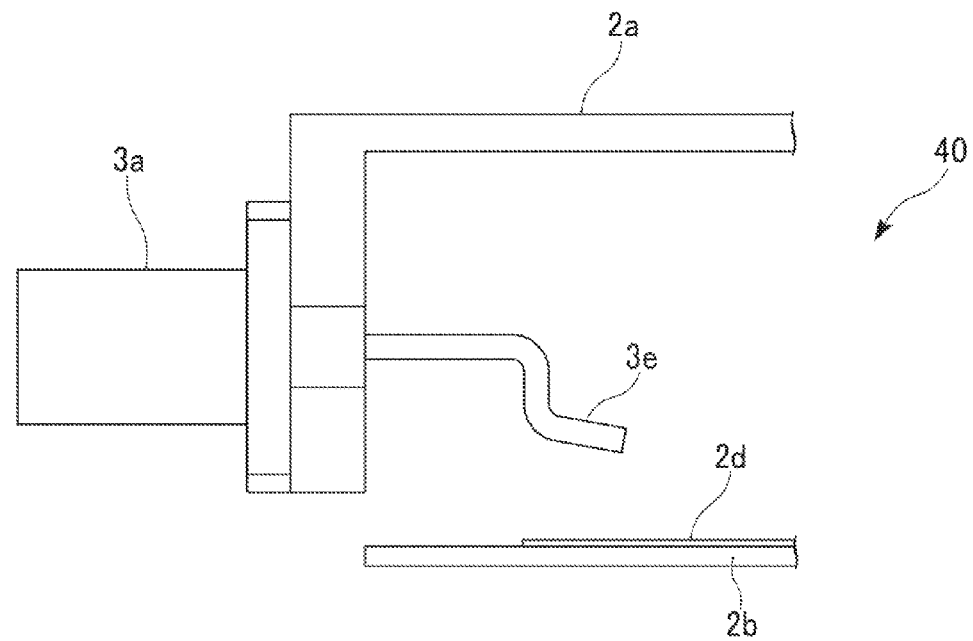
FIG. 9 is a side sectional view showing the structure of a high-frequency module according to a fifth embodiment of the invention.

FIG. 9 is a side sectional view showing a structure of a high-frequency module 40 according to a fifth embodiment of the invention. Additionally, in this embodiment, the same reference numerals will be given to the same components as those of the first embodiment, and the description thereof will be omitted.

In this embodiment, a spring-shaped center conductor 3e is provided instead of the center conductor 3d. That is, the center conductor of the coaxial connector 3a is formed in a Z-shape so that a front end thereof has a spring property. Additionally, in this embodiment, the spring-shaped center conductor 3e contacts with the print wiring 2d at one contact point. Since the spring-shaped center conductor 3e directly contacts with the print wiring 2d formed on the substrate 2b without the metal plate terminal, it is advantageous in that the cost is reduced and the positional precision is improved.

Figure 10:
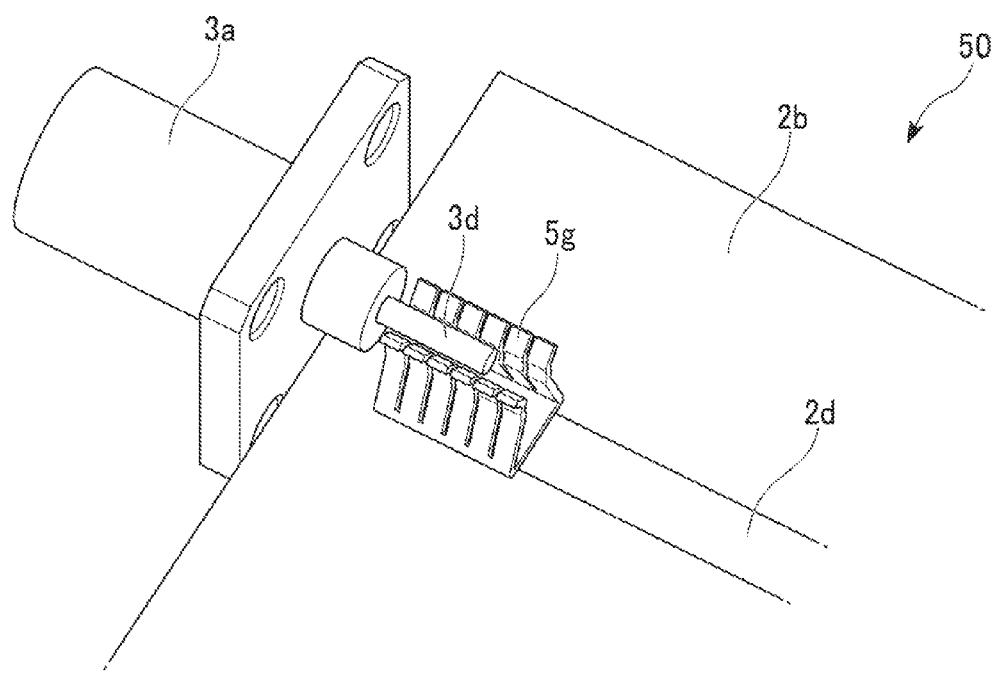
FIG. 10 is a perspective view showing the structure of a high-frequency module according to a sixth embodiment of the invention.

FIG. 10 is a perspective view showing a structure of a high-frequency module 50 according to a sixth embodiment of the invention. Additionally, in this embodiment, the same reference numerals will be given to the same components as those of the first embodiment, and the description thereof will be omitted.

In this embodiment, as shown in FIG. 10, the metal plate terminal is provided with a plurality of slits, thereby obtaining a multi-contact-point terminal 5g.

Figure 11:
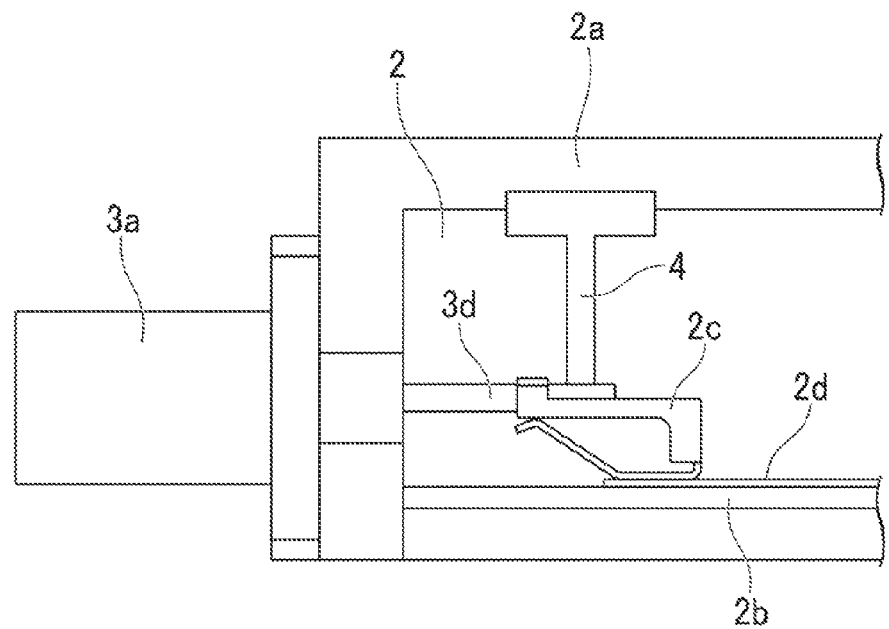
FIG. 11 is a side sectional view showing the structure of a high-frequency module according to a seventh embodiment of the invention.
Figure 12:
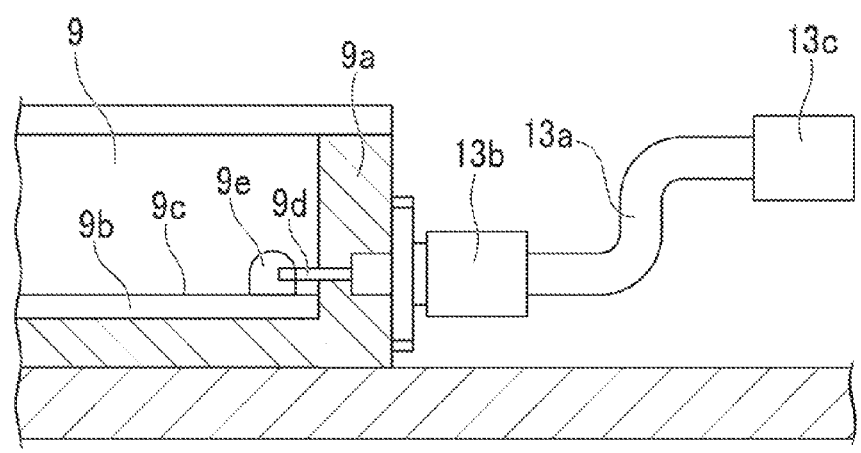
FIG. 12 is a view showing an example of a general module connection structure.
Figure 13:
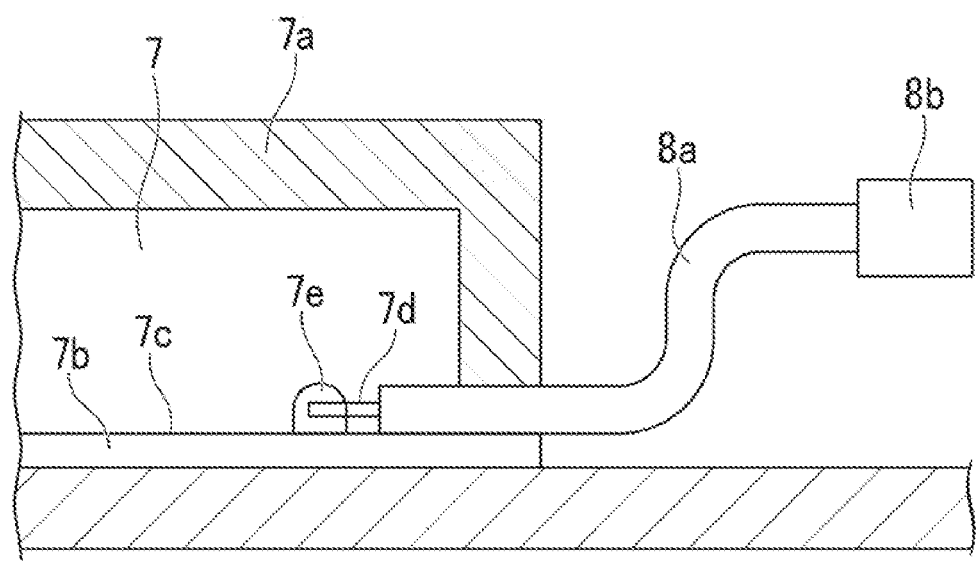
FIG. 13 is a view showing another example of a general module connection structure.

FIG. 11 is a side sectional view showing the structure of a high-frequency module 60 according to a seventh embodiment of the invention. Additionally, in this embodiment, the same reference numerals will be given to the same components as those of the first embodiment, and the description thereof will be omitted.

Like the structures of the high-frequency modules shown in FIGS. 1 to 3 and FIGS. 7 to 10, in the connection structures of the type in which a force is applied to the center conductor in a shear direction during the connection operation, it is possible to use the structure shown in FIG. 11. That is, a ceiling portion of the shield cover 2a is provided with an insulating hold member 4 having low permittivity not having an influence on electric characteristics. In addition, while the center conductor 3d is held by the insulating hold member 4, it is possible to improve the connection strength or the long-time reliability.

The shapes of the above-described metal plate terminals are selectively used depending on the required performance or cost so that the SMD automatic mounting operation can be performed. In addition, while the metal plate terminal suitable for a diameter of the center conductor of the coaxial connector is prepared, the type of the coaxial connector may not be selected. Further, in the structures of the metal plate terminals, since the inside of the high-frequency module is completely shielded by the shield cover, the shield state is ensured.

The connection structures of the high-frequency modules according to the respective embodiments may be used for the connection structure between the high-frequency modules used in, for example, a base station or the like.

As described above, the exemplary embodiments of the invention are described in detail. However, the invention is not limited thereto, but may be, of course, modified into various forms in the scope without departing from the spirit of the invention.

INDUSTRIAL APPLICABILITY

The present invention can be applied to the high-frequency module, the wireless device, and the like capable of improving the electric characteristics and easily performing out the assembling operation and the inspection operation without performing the soldering operation in the input-output connection of the high-frequency signal.

The invention claimed is:

1. A high-frequency module comprising:
a shield cover of the high-frequency module;
a coaxial connector which is fixed to an outer side surface of the shield cover;
a center conductor of the coaxial connector which protrudes to the inside of a region of the high-frequency module; and
a metal plate terminal which is mounted on a print wiring formed on a substrate,
wherein the shield cover is fixed to the substrate so as to cover an upper portion of the substrate, while the center conductor of the coaxial connector is fitted to the metal plate terminal so as to allow input and output of a high-frequency signal, and
wherein the center conductor contacts with the metal plate terminal at only one point.

2. The high-frequency module according to claim 1, wherein the metal plate terminal includes two or more arms which are fitted to the coaxial connector.

3. The high-frequency module according to claim 1, wherein the metal plate terminal includes a curved portion, and
wherein the center conductor is interposed in the curved portion.

4. The high-frequency module according to claim 1, wherein the metal plate terminal includes a plurality of slits.

5. The high-frequency module according to claim 1, wherein the metal plate terminal is formed by a spring member so as to contact with the center conductor at one contact point.

6. The high-frequency module according to claim 1, further comprising:
an insulating hold member which is provided in a ceiling portion of the shield cover so as to prevent a shear force applied from the coaxial connector to the center conductor and to hold the center conductor while the coaxial connector is connected to the center conductor with the metal plate terminal interposed therebetween.

7. The high-frequency module according to claim 1, wherein an axial direction of the center conductor is parallel to a direction vertical to the surface of the substrate.

8. A high-frequency module comprising:
a shield cover of the high-frequency module;
a coaxial connector which is fixed to an outer side surface of the shield cover;
a center conductor of the coaxial connector which protrudes to the inside of a region of the high-frequency module; and
a print wiring which is formed on a substrate,
wherein the center conductor is formed in a Z-shape so that a front end thereof has a spring property, and
wherein the shield cover is fixed to the substrate so as to cover an upper portion of the substrate, while the center conductor of the coaxial connector directly contacts with the print wiring so as to allow input and output of a high-frequency signal, and
wherein the center conductor contacts with the print wiring at only one point.

9. A wireless device comprising:
a high-frequency module,
wherein the high-frequency module comprises:
a shield cover of a high-frequency module;
a coaxial connector which is fixed to an outer side surface of the shield cover;
a center conductor of the coaxial connector which protrudes to the inside of a region of the high-frequency module; and
a metal plate terminal which is mounted on a print wiring formed on a substrate,
wherein the shield cover is fixed to the substrate so as to cover an upper portion of the substrate, while the center conductor of the coaxial connector is fitted to the metal plate terminal so as to allow input and output of a high-frequency signal, and
wherein the center conductor contacts with the metal plate terminal at only one point.

* * * * *